United States Patent [19]

Kamisawa

[11] Patent Number: 5,627,013
[45] Date of Patent: May 6, 1997

[54] METHOD OF FORMING A FINE PATTERN OF FERROELECTRIC FILM

[75] Inventor: Akira Kamisawa, Kyoto, Japan

[73] Assignee: Rohm Co., Ltd., Kyoto, Japan

[21] Appl. No.: 974,497

[22] Filed: Nov. 12, 1992

[30] Foreign Application Priority Data

| Nov. 14, 1991 | [JP] | Japan | 3-299287 |
| Nov. 14, 1991 | [JP] | Japan | 3-299288 |
| Nov. 14, 1991 | [JP] | Japan | 3-299289 |

[51] Int. Cl.$^6$ ............................. G03F 7/30; G03F 7/40
[52] U.S. Cl. ................. 430/325; 430/197; 430/287.1; 430/311; 430/330; 430/910; 156/173; 156/184; 156/185; 264/619; 501/134
[58] Field of Search ........................ 430/325, 311, 430/330, 910, 197, 287.1; 156/667, 668, 173, 184, 185; 264/60, 61; 501/134

[56] References Cited

U.S. PATENT DOCUMENTS

| 4,759,823 | 7/1988 | Asselanis et al. | 430/313 |
| 4,828,961 | 5/1989 | Lau et al. | 430/311 |
| 4,946,710 | 8/1990 | Miller et al. | 427/126.3 |
| 5,100,764 | 3/1992 | Paulson et al. | 430/311 |
| 5,188,902 | 2/1993 | Lin | 428/426 |

OTHER PUBLICATIONS

Yoshiharu Ozaki et al, Preliminary Manuscript of 1990's Lecture for Japan Ceramics Association, Evaluation of Solubility of Alkoxide for composing PZT.

Science and Applications of Sol–Gel Method, 1989, Seminar Lecture of Color Materials (Jul. 4 to 6, 1989).

Vinay K. Seth et al, Ferroelectrics, vol. 112, pp. 283–307, 1990.

Tadashi Shiosaki et al, Japanese Journal of Applied, vol. 26, pp. 159–161, 1987.

M. R. Poor et al, Material Research Society Symposium Proceedings, vol 200 pp. 211–216, 1990.

*Primary Examiner*—John S. Chu
*Attorney, Agent, or Firm*—Birch, Stewart, Kolasch & Birch, LLP

[57] ABSTRACT

For forming a fine pattern of ferroelectric film without using a resist, a solution containing polyalkoxide having ferroelectric components, as a base part, and functional groups to be activated when exposed to electromagnetic waves or corpuscular beams is used as a pattern forming agent. The pattern form agent is coated onto a substrate, and then electromagnetic or corpuscular beams are radiated thereover to form crosslinks between molecules in the agent. After the crosslinks are cured, the portions devoid of any crosslink and hence uncured are removed using a solvent. Then the molecules associated with the crosslinks remaining on the substrate are then heated to form a ferroelectric crystal.

17 Claims, 6 Drawing Sheets

METHOD OF FORMING A FINE PATTERN OF FERROELECTRIC FILM

BACKGROUND OF THE INVENTION

1. Field of the Invention:

This invention relates to a method of forming a fine pattern of ferroelectric film in the production of ferroelectric memories, ferroelectric sensors, superconductive devices, etc., and also to a pattern forming agent suitable for use with such a formation method.

2. Description of the Related Art:

There is currently proposed, as a new semiconductor memory device, a film-like ferroelectric memory which uses a material having a polarization inverting characteristic and being fusible in a semiconductor process. Since it is involatile, such a ferroelectric memory may be used as an involatile memory and requires only a small amount of voltage or current during reloading, thus realizing a practical involatile memory. In an ordinary semiconductor memory such as EPROM, since it is necessary to apply a more excessive current or voltage than usual or to place the memory in an unusable condition in order to clear the stored contents, a separate current source or voltage source dedicated for clearing is needed. However in the proposed ferroelectric memory, since the stored contents can be altered or cleared under normal conditions, it would be unnecessary to equip such a separate current source or voltage source.

The ferroelectric material is widely used, in addition to the above-described ferroelectric memories, in various ferroelectric sensors and liquid crystal displays as well as superconductive devices and functional glass. In these applications, since a ferromagnetic film must be processed into a predetermined pattern, a method of forming a fine pattern of ferroelectric film is important.

In conventional methods, a predetermined pattern is formed using the following process. A ferroelectric film is formed by RF sputtering, whereupon the ferroelectric film is crystallized by fireing. The resulting ferroelectric film is then processed by a fine-pattern treatment, such as chemical wet etching, ion milling such as physical dry etching, or plasma etching using hydrogen chloride or tetrafluoromethane, for example. In wet etching, if the etching solution is an alkaline solution such as of potassium hydroxide or sodium hydroxide, an alkali-proof resist for the photosensitive film is formed by lithography, whereupon film portions other than a predetermined pattern are removed using the etching solution. Thus a desired pattern of ferroelectric film is obtained. If the etching solution is an acidic solution such as of phosphoric acid, sulfuric acid, hydrocloric acid or fluoric acid, an acid-proof resist for the photosensitive film should be used.

However these conventional processes have the following problems:

(1) In wet etching, since it is an isotopic etching, the pattern to be left over tends to become too narrow and/or the resist tends to peel off, and so that fine patterning cannot be achieved.

(2) Though it is excellent for fine processing, ion milling step still has problems such as causing damage to the substrate and making it difficult to select a suitable resist.

(3) Plasma etching has a very poor etching rate, is not suitable for mass production and causes a lot of damage to the substrate, often breaking the active wiring layer under the resist.

SUMMARY OF THE INVENTION

It is therefore an object of this invention to provide a method of forming a fine pattern of ferroelectric film In simple steps, and to provide a pattern forming agent suitable for use in such a method.

A more specific object of the invention is to provide a method and an agent for forming a fine pattern of ferroelectric film without using any resist.

According to a first aspect of the invention, there is provided a pattern forming agent for use in forming a fine pattern of ferroelectric film, wherein the pattern forming agent is a solution containing a polyalkoxide (hereinafter called "the photo active polymer") having ferroelectric components, as a base part, and functional groups which can be activated by exposure to electromagnetic waves or corpuscular beams. The pattern forming agent is coated onto a substrate, and electromagentic waves or corpuscular beams are then radiated over the coated substrate to form crosslinks between molecules in the agent, whereupon the photo-active-polymer layer portions devoid of crosslinks are removed using a solvent. The molecules associated with the crosslinks left over on the substrate are then processed with a thermal treatment to form a ferroelectric crystal.

According to a second aspect of the invention, there is provided a method for forming a fine pattern of ferroelectric film, comprising the steps of: coating onto a substrate the photo-active-polymer-containing solution (the first pattern forming agent of the invention); drawing a circuit pattern on the substrate by radiating the electromagnetic waves or the corpuscular beams along the circuit pattern (by exposing the circuit pattern to the electromagnetic waves or the corpuscular beams); developing the circuit pattern on the substrate by soaking the radiated substrate in a predetermined solvent; and fireing the developed circuit pattern.

In this pattern forming method, the photo-active-polymer-containing solution (the first pattern forming agent of the invention) is coated onto the substrate.

Then in the drawing (exposing) step, the electromagnetic waves or corpuscular beams (hereinafter called "electromagnetic waves") are radiated over the coated substrate along a desired circuit pattern.

At the agent areas exposed to the electromagnetic waves, the functional groups of the photo active polymer contained in the pattern forming agent are activated to produce various activated molecules. Since these activated molecules attack unsaturated bonds of the functional groups of another metal-alkoxide polymer to polymerize therewith, crosslinks are formed between the metal-alkoxide polymers contained in the pattern forming agent. Upon formation of the crosslinks between the polymers, the pattern forming agent is cured so as to be insoluble in virtually any solvent. Consequently, when the coated substrate is soaked in a suitable known solvent after having been exposed to the electromagnetic waves along a desired circuit pattern, the unexposed portions are then washed away while only the exposed portions remain on the substrate.

In the fireing step, when the circuit pattern remaining on the substrate is fired at a temperature of about 600° to 800° C., the organic functional groups of the high polymer compound constituting the circuit pattern are removed while only the ferroelectric components remain in the circuit pattern and are then crystallized under heat. As a result, a fine pattern ferroelectric film has been formed along the desired circuit pattern.

The photo active polymer is preferably a metal-alkoxide polymer having functional groups with unsaturated bonds and atoms other than of Carbon or Hydrogen (hereafter known as heteroatoms). The metals of the metal-alkoxide are exemplified by Pb, Zr, Ti, Ba and La, which are materials such as of PZT or PLZT.

In the above-mentioned pattern forming method, if the photo active polymer is a metal-alkoxide polymer having functional groups with unsaturated bonds, a solution containing the metal-alkoxide polymers is coated onto the substrate, and the coated substrate is exposed to the electromagnetic waves. At the exposed areas, the unsaturated bonds of the functional groups of the metal-alkoxide polymer contained in the pattern forming agent are broken to generate radicals. By the well-known radical reaction, these radicals attack the unsaturated bonds of functional groups of another metal-alkoxide polymer to polymerize therewith. Accordingly the exposed areas produce new bonds between the metal-alkoxide polymers to form a network polymer. Then the portions formed with the network polymer are cured so as to become insoluble in virtually any solvent. Therefore, in the developing step, when the exposed substrate is soaked in a predetermined solvent, the exposed portions are left over in a desired circuit pattern on the substrate.

In the fireing step, a fine pattern of ferroelectric film is formed along the desired circuit pattern.

The photo active polymer should by no means be limited to a metal-alkoxide polymer having functional groups with unsaturated bonds and may be a metal-alkoxide polymer with functional groups having an unstable structure such as $\alpha,\beta$-unsaturated carbonyl compounds. For the reason described above, the metals of the metal-alkoxides are exemplified by Pb, Zr, Ti, Ba and La, which are materials such as of PZT or PLZT.

In the pattern forming method, if the photo active polymer is a metal-alkoxide polymer with functional groups having an unstable structure, a solution containing the metal-alkoxide polymers is coated onto the substrate, and the coated substrate is exposed to electromagnetic waves. At the exposed areas, this metal-alkoxide polymer contained in the pattern forming agent is broken more easily than the unsaturated bonds of the functional groups of the metal-alkoxide polymer to generate radicals. These radicals attack the unsaturated bonds of functional groups of another metal-alkoxide polymer to polymerize therewith. Accordingly the exposed areas produce new bonds between the metal-alkoxide polymers to form a network polymer. Then the portions formed with the network polymer are cured so as to become insoluble in virtually any solvent. Therefore, in the developing step, when the exposed substrate is soaked in a predetermined solvent, the exposed portions are left over in a desired circuit pattern on the substrate.

In the fireing step, a fine pattern of ferroelectric film is formed along the desired circuit pattern.

As a second pattern forming agent, a photo active polymer (polyalkoxide having ferroelectric components and functional groups to be activated when exposed to electromagnetic waves or corpuscular beams), and a photo active compound to be activated, when exposed to electromagnetic waves or corpuscular beams, so as to form crosslinks in the alkoxide polymer are dissolved in a solvent.

This photo active compound sensitive to electromagnetic waves or corpuscular beams to form crosslinks between polymers is preferably an aromatic bis-azide compound.

The method using the second pattern forming agent comprises coating onto the substrate a solution containing the photo active polymer and the photo active compound (the second pattern forming agent), drawing a circuit pattern on the substrate by radiating the electromagnetic waves or the corpuscular beams along the circuit pattern, developing the circuit pattern on the substrate by soaking the radiated substrate in a predetermined solvent, and fireing the developed circuit pattern.

According to this pattern forming method, in the coating step, the solution (the second pattern forming agent) containing the photo active polymer and the photo active compound is coated over the substrate.

Then in the drawing (exposing) step, the substrate coated with the mixed solution is exposed to electromagnetic waves or corpuscular beams along a desired circuit pattern.

In the exposed areas of the second pattern forming agent, the functional groups of the photo active polymer and those of the photo active compound are respectively activated to generate various activated molecules. Since these activated molecules serve as a crosslinking agent to attack the unsaturated bonds of the functional groups of another metal-alkoxide polymer to polymerize therewith, crosslinks are formed between the metal-alkoxide polymers of the pattern forming agent to produce a network polymer. Having this network polymer, such portions of the pattern forming agent are then cured so as to be insoluble in any solvent. Therefore, by washing the whole of the exposed substrate with a suitable solvent, it is possible to leave only the exposed portions on the substrate. In the developing step, the exposed substrate is soaked in a predetermined solvent to wash away the unexposed portions while the exposed portions in a desired circuit pattern remain on the substrate.

Then in the fireing step, when the circuit pattern remaining on the substrate is fired at a temperature of about 600° to 800° C., the organic functional groups of the high polymer compound constituting the circuit pattern are removed while only the ferroelectric components are left in the circuit pattern and are then crystallized under heat. As a result, a fine pattern ferroelectric film has been formed along the desired circuit pattern.

Since the photo active compound is more sensitive to the electromagnetic waves than the photo active polymer, the second pattern forming agent has a better response to the electromagnetic waves and hence can be cured, when exposed to the electromagnetic waves, more easily compared to the first pattern forming agent.

DETAILED DESCRIPTION

Preferred examples of a method for forming a fine pattern of ferroelectric film according to this invention will now be described with reference to the accompanying drawings.

Fine-Pattern Forming Method

In this method, a pattern forming agent is a solution containing a polyalkoxide (the photo active polymer) having ferroelectric components, as a base part, and functional groups to be activated when exposed to electromagnetic waves or corpuscular beams. The pattern forming agent is coated onto a substrate, and electromagnetic waves or corpuscular beams are then radiated over the coated substrate to form crosslinks between molecules in the agent, whereupon the photo-active-polymer layer portions devoid of crosslinks are removed using a solvent. The molecules associated with the crosslinks left on the substrate are then processed with thermal treatment to form a ferroelectric crystal.

Figure 1:
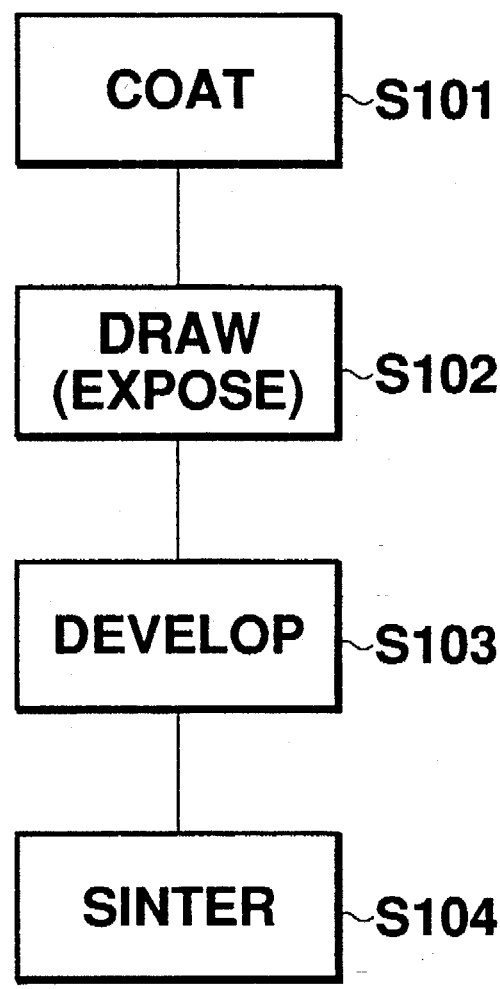
FIG. 1 is a flow diagram showing a succession of processing steps when producing a first pattern forming agent, according to this invention, to be used in forming a fine pattern of ferroelectric film.

FIG. 1 is a flow diagram showing a succession of processing steps of the pattern forming method.

In this embodiment, in the coating step S101, the pattern forming agent is coated onto the substrate. Then in the drawing (exposing) step S102, the coated substrate is exposed to light (or electromagnetic waves) along a predetermined pattern, whereupon in the developing step S103, the exposed substrate is soaked in a predetermined solvent to remove the unexposed portions of the pattern forming agent on the substrate. At that time, since the pattern forming agent at the exposed areas is cured, the pattern forming agent at the unexposed areas is removed while only the pattern forming agent in the predetermined pattern remains on the substrate. In the fireing step S104, the predetermined pattern of the pattern forming agent remaining on the substrate is treated with heat. During the fireing step, the organic functional groups of the polyalkoxide are removed while the ferroelectric components are left on the substrate and are then crystallized to produce a ferroelectric (e.g., PZT or PLZT) having a perovskite structure. In the drawing (exposing) step S102, the substrate may be exposed to electromagnetic waves other than light, or to other corpuscular beams (e.g., electron rays or neutron rays).

Figure 2:
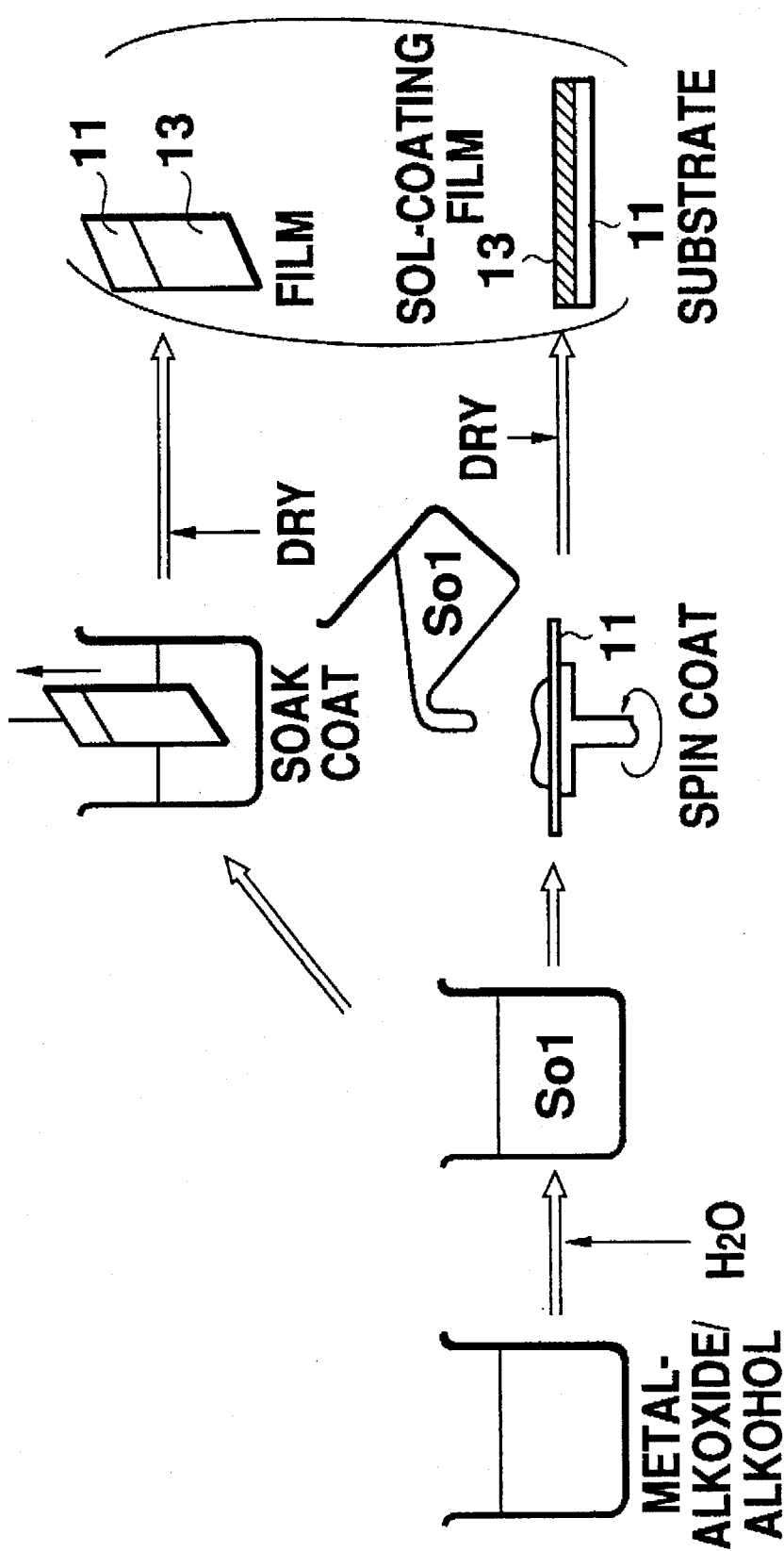
FIG. 2 shows one stage of operation (the pattern-forming-agent coating step) of a fine-pattern forming method according to the invention in a concrete form.

FIG. 2 shows one stage of operation of the pattern forming method in concrete form.

In this pattern forming method, for obtaining a polyalkoxide having predetermined metals, various kinds of metal-alkoxides as material are dissolved in alcohol to prepare a starting solution. The predetermined metals are exemplified by Pb, Zr, Ti, Ba and La, which are materials such as PZT or PLZT. When water as a catalyst is added to this starting solution, a hydrolysis reaction and condensation reaction respectively expressed by the following reaction formulas (1) and (2) take place to produce polyalkoxide. This method is generally known as the sol-gel method. The polyalkoxide to be used in the pattern forming method may be produced easily using this known sol-gel method.

SOL-GEL Method

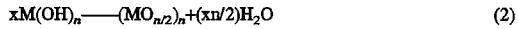

$$M(OR)_n + nH_2O \longrightarrow M(OH)_N + nHOR \quad (1)$$

$$xM(OH)_n \longrightarrow (MO_{n/2})_x + (xn/2)H_2O \quad (2)$$

In this embodiment, the solution containing polyalkoxide is coated onto a platinum substrate 11 (the coating step) by spinning or soaking, as shown in FIG. 2. By spin coating, it is possible to coat the solution over the substrate uniformly so that a film having a uniform thickness can be formed. The thickness of the film formed in the coating step is about 400 to 800 angstrom; and the coating method used may be selected depending on the thickness.

Figure 3:
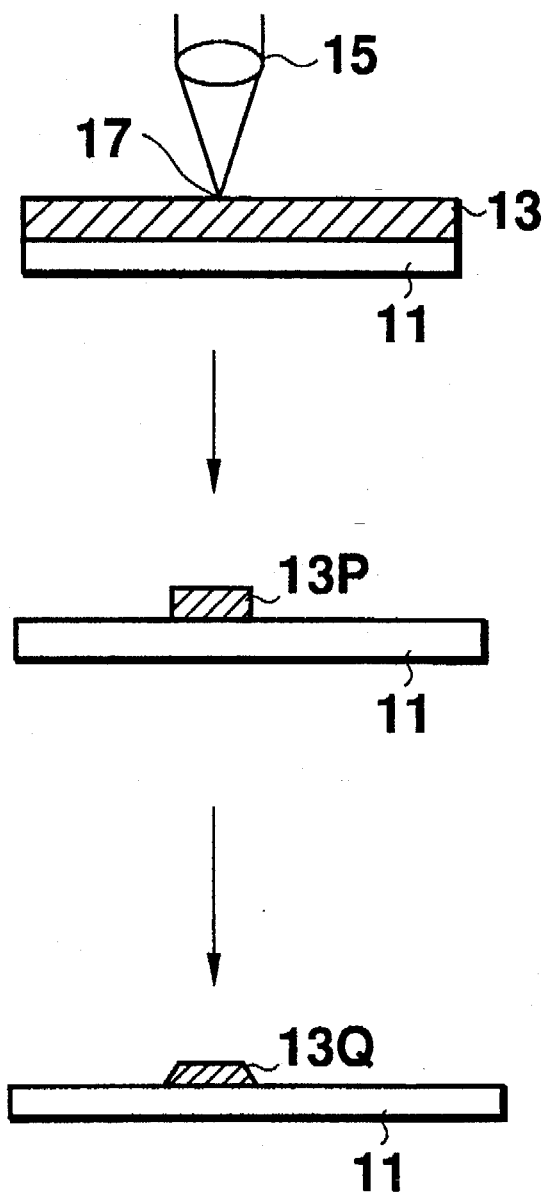
FIG. 3 shows another stage of operation (the developing step and the fireing step) of the fine-pattern forming method.

FIG. 3 shows the developing steps and the fireing step of the pattern forming method in a concrete form.

As shown in FIG. 3, light is radiated onto the solution 13, which is coated on the substrate 11, along a predetermined pattern by a light radiating means 15. At that time, since a light polymerization reaction takes place at the exposed areas, the solution 13 is cured along a predetermined pattern. Upon exposure to light, unsaturated bonds contained in the high-polymeric compound are partly broken to generate radicals. As these radicals attack other polyalkoxide, bonds are generated there to produce a high polymer of a large molecular mass. The larger the molecular mass, the more its viscosity increases. Utilizing this viscosity difference, it is possible to remove the areas other than the areas exposed to laser beams by a conventional means, such as a $CO_2$ laser or an excimer laser. The coated substrate 11 may be exposed to electron rays, X-rays or ultraviolet rays.

Subsequently, the solution 13 other than the exposed portions is removed from the substrate 11 by a solvent which dissolves the polyalkoxide. In this embodiment, the solution 13 is removed from selected areas using an organic solvent of an aromatic group such as benzene or toluene; that is, even when the solution 13 is removed from the substrate 11, the cured portions 13P cured by light radiation remains on the substrate 11. Since light radiation is given along a predetermined pattern, the cured portion 13P in the predetermined pattern is formed on the substrate 11.

Then when the cured portion 13P is treated with heat, a fine pattern 13Q of ferroelectric film is formed. In the polyalkoxide polymerized by thermal treatment of 600° to 800° C., organic portions are removed while ferroelectric components are left on the substrate. With continued heating, the remaining components are crystallized to assume a perovskite structure so that a fine pattern 13Q of ferroelectric film such as PZT and PLZT is formed.

In the foregoing pattern forming methods, resistless fine processing can be achieved, and it is possible to minimize damage caused during dry etching, thus simplifying the process and reducing the cost of production.

Various pattern forming agents suitable for use in the pattern forming method will now be described.

Fine-Pattern Forming Agent (FIRST EXAMPLE)

In this example, the photo active polymer is a metal-alkoxide polymer containing functional groups with unsaturated bonds, as expressed by the following formula (3). The feature of this polymer is that it has unsaturated bonds and ferromagnetic components (such as PZT or PLZT), which generate radicals to cause polymerization and hence solidification by light radiation. When the polymerized molecules are heated, the organic functional portions are removed and, at the same time, crystallization occurs to form a ferroelectric.

$$\begin{array}{ccc} R_1 & R_2 & R_1 \\ | & | & | \\ {+}M{-}O{)}{-}{(}M{-}O{)}{-}{(}M{-}O{)}{+} \\ | & | & | \\ R_1 & R_2 & R_3 \end{array} \quad \text{Formula (3)}$$

$R_1$: —$CH_3$, —$C_2H_5$ $R_2$: —$CH=CH_2$ $R_3$: 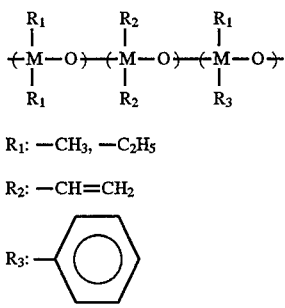

M: Pb, Zr, Ti, La, Ba, Bi, Si, Li and Nb where $R_1$ represents an alkyl group such as —$CH_3$ or —$C_2H_5$, $R_2$ represents an unsaturated functional group such as —$CH=CH_2$, $R_3$ represents an aryl group such as benzine, toluene, and M represents a metal-atom selected from the group consisting of at least Pb, Zr, Ti, La and Ba.

The polyalkoxide as expressed by the formula (3) can be easily produced using the known sol-gel method. Various kinds of metal-alkoxides as materials are dissolved in alcohol to prepare a starting solution. When water as a catalyst is added to this starting solution, hydrolysis reaction and condensation reaction respectively expressed by the following reaction formulas (1) and (2) take place to produce the polyalkoxide as expressed by the formula (3).

As already described above, the metal-alkoxide as expressed by the formula (3) is coated onto the substrate 11, and electromagnetic wave radiation is applied thereover in a predetermined pattern to generate radicals to cause a well-known chain reaction to form crosslinks between molecules for solidification. Then the not cured portions removed by a solvent while only the cured portions remain on the substrate. The cured portions are treated with heat to remove and crystallize the organic functional portions concurrently. Thus it is possible to form a desired fine pattern of ferroelectric film on the substrate 11, without using any resist.

A polymerization retardant such as diethanol amine and a sensitizer such as 1-nitropylene or 1,8-dinitropylene may be added to the solution 13 as required. To improve the sensitivity to electromagnetic waves, an aromatic bisazide compound may be added to the solution 13 to form crosslinks in the polyalkoxide.

(SECOND EXAMPLE)

A polymer (base polymer) to be used as the material of a photo active polymer in this example is expressed by the following formula.

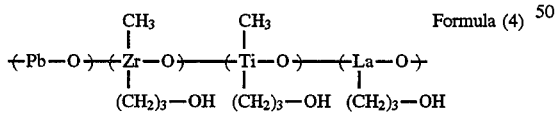

This base polymer contains metal-atoms selected from the group consisting of at least zirconium, lead, titan and lanthanum, which are ferromagnetic materials of PZT and PLZT. When the photo active polymer derived from the base polymer is treated at high temperature, organic components in molecules are removed by oxidation so that only components forming a ferroelectric film such as PZT remain on the substrate. With continued high-temperature treatment, the remaining ferroelectric components are progressively crystallized into a perovskite structure composed of fine crystal particles.

Figure 4:
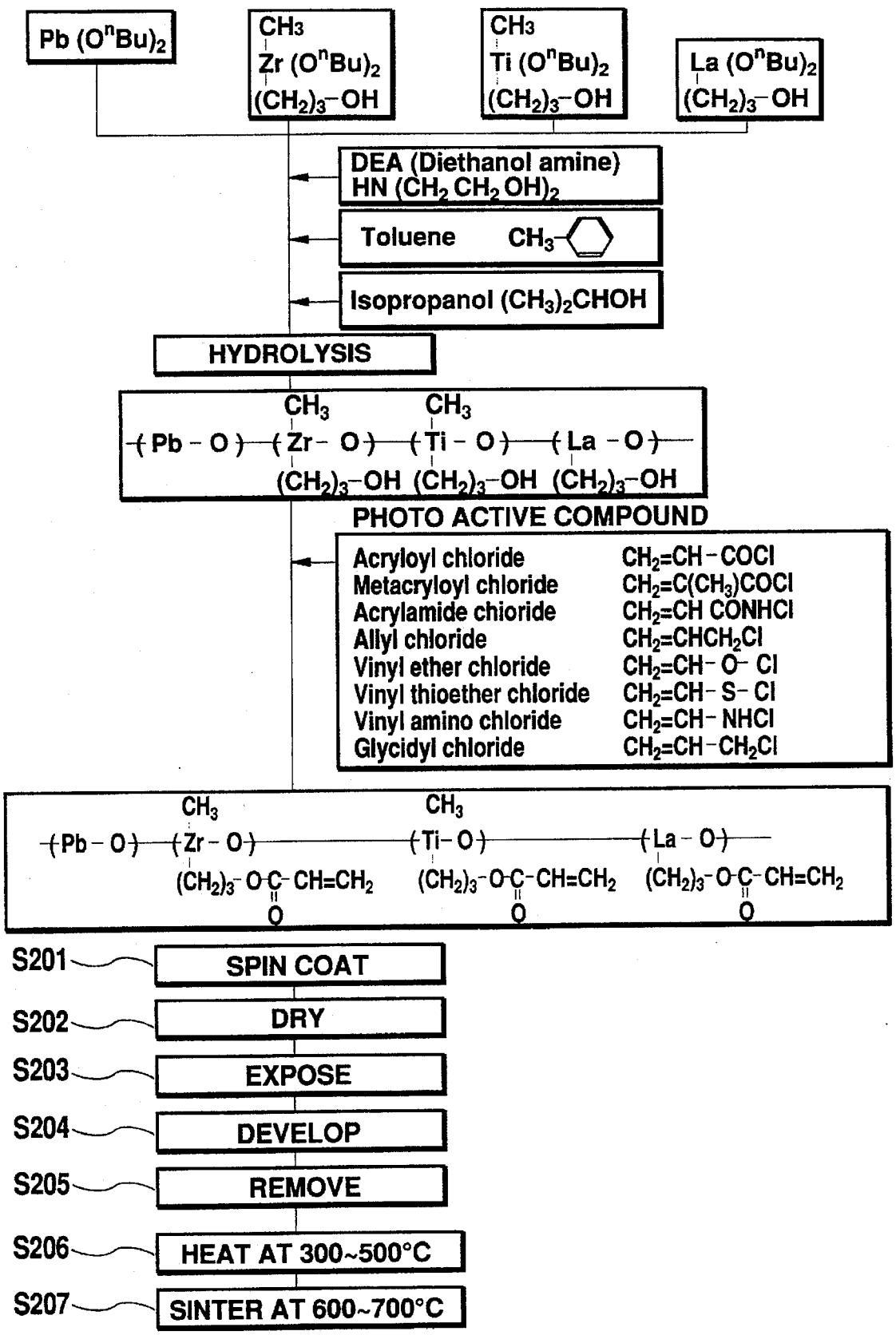
FIG. 4 is a flow diagram showing a succession of processing steps when producing a second pattern forming agent according to the invention, and a succession of processing steps of a pattern forming method using the second pattern forming agent.

FIG. 4 is a flow diagram showing a succession of processing steps when producing a second pattern forming agent according to the invention, and a succession of processing steps of a pattern forming method using the second pattern forming agent.

Firstly, metal-butoxides having 1-hydroxypropyl groups in molecules are mixed up, and then diethanol amine as a polymerization retardant is added to the mixture. Toluene and isopropanol are added to the resulting mixture to obtain a solution containing the metal-butoxide. When water is added to the solution, hydrolysis takes place to produce butanol and metal hydroxides, whereupon metal hydroxides cause a polymerization reaction with one another to produce the base polymer.

In this example, the base polymer is a polyalkoxide containing the above-mentioned metal elements as pivot atoms, and organic functional groups having alcoholic hydroxyl groups are C-bonded with the respective pivot atoms. When various photo active compounds expressed by the following formulas (5) are mixed with the solution containing this base polymer, a condensation reaction will soon take place to produce a photo active polymer as expressed by the formula (6). This photo active polymer is an unstable compound containing $\alpha,\beta$-unsaturated carbonyl, and the unsaturated bonds are apt to break when exposed to electromagnetic waves. Upon radiation of electromagnetic waves to the photo active polymer, the unsaturated bonds are broken and, at the same time, bonds occur to form crosslinks between molecules. As the molecular mass is thus increased due to the crosslinks, the viscosity of the fine-pattern forming agent containing the photo active polymer will be increased. Therefore it is possible to separate the exposed portions and the unexposed portions from one another by conventional technology.

| | | Formula (5) |
|---|---|---|
| Acryloyl chloride | $CH_2=CH-CHCl$ | |
| Metacryloyl chloride | $CH_2=CH(CH_3)-COCl$ | |
| Acrylamide chloride | $CH_2=CH-CONHCl$ | |
| Allyl chloride | $CH_2=CHCH_2Cl$ | |
| Vinyl ether chloride | $CH_2=CH-O-Cl$ | |
| Vinyl thio ether chloride | $CH_2=CH-S-Cl$ | |
| Vinyl amino chloride | $CH_2=CH-NHCl$ | |
| Glycidyl chloride | $CH_2-CH-CH_2Cl$ | |

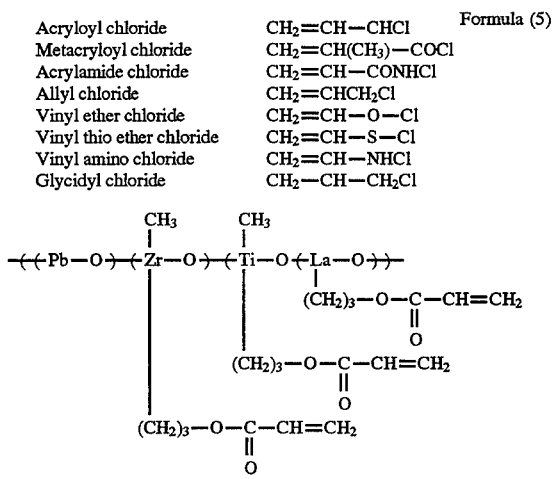

In the second example, as the photo active polymer as expressed by the formula (6) is mixed in a suitable solvent such as acetone, the second fine-pattern forming agent is obtained.

Since the reaction is retarded by diethanol amine previously added to the reaction mixture, it is possible to adjust the molecular length of the base polymer and the molecular length of the photo active polymer; that is, it is possible to adjust the viscosity of the fine-pattern forming agent containing these polymers. If its viscosity is too high, such an agent is not suitable for the fine-pattern forming method of this invention. This is true partly because such a highly viscous agent is not suitable for being coated onto the substrate at a constant temperature and also because it is not suitable for being removed from the areas outside the predetermined pattern. A sensitizer such as 1-nitropylene or 1,8-dinitropylene may be added as required.

The second fine-pattern forming agent is first stirred so as to have a uniform structure, whereupon in the coating step S201 it is coated uniformly over the substrate. In this example, spin coating is used to achieve uniform coating. After being dried for a while, the coated substrate is exposed at selected areas to ultraviolet rays, X-rays or corpuscular beams (hereinafter also called "electromagnetic waves").

When this fine-pattern forming agent is exposed to electromagnetic waves, crosslinks are formed between molecules in the exposed areas where the molecules become larger than those at the crosslink-free areas. Therefore at only the crosslinked areas, the fine-pattern forming agent is remarkably increased in viscosity and becomes hard. Once it has become hard, the fine-pattern forming agent becomes insoluble in virtually any solvent. Therefore only the portions free of the crosslinking reaction can be removed while the other portions treated with the crosslinking reaction can remain on the substrate. If light radiation takes place along a predetermined pattern, only the portions in the predetermined pattern can remain on the substrate. In the developing step S204, light radiation is done along a predetermined pattern. As the crosslinking reaction occurs along a predetermined pattern of areas, only the fine-pattern forming agent at the exposed areas becomes markedly lower in fluidity and hence hard so that it will become insoluble in virtually any organic solvent. In the developing step S204, acetone is used as a solvent, and the fine-pattern forming agent at the unexposed areas is removed while the exposed portions remain on the substrate (S205). In the developing step S204, the exposed portions can be removed with adjustable ease by adjusting the quantity of diethanol amine previously added in the group as a polymerization retardant.

Subsequently, in the heating step S206, the fine-pattern forming agent is dried at 300° to 500° C. and, in the fireing step S207, it undergoes thermal treatment. During the fireing step S207, when the fine-pattern forming agent is heated at 600° to 700° C., the organic functional groups will be oxidized so as to be removed from the crosslinked high polymer compound, and at the same time, the residual metal-alkoxide portions are crystallized to have a perovskite structure.

In this example, light radiation is applied to the fine-pattern forming agent along a predetermined pattern, whereupon the agent at the predetermined pattern is removed based on the viscosity difference between the exposed areas and the unexposed areas. Thus it is possible to form a fine pattern of ferroelectromagnetic film on the substrate without using any resist.

As described above, the fine-pattern forming agent of this example can be produced without using any resist, minimizing possible damage during dry etching and simplifying the process.

(THIRD EXAMPLE)

A fine-pattern forming agent of this example contains, in addition to a polyalkoxide having ferroelectric components and unsaturated bonds, an aromatic bis-azide compound which assists in forming crosslinks between molecules of the polyalkoxide. Electromagnetic waves are radiated to the fine-pattern forming agent to form crosslinks between the molecules, and then only the crosslinked molecules remain on the substrate and are thermally treated to produce a ferroelectric crystal. Thus in this example, the polyalkoxide having ferroelectric components and unsaturated bonds is a photo active polymer, and the aromatic bis-azide compound is a photo active compound; the photo active compound is added to the photo active polymer, and the resulting mixture is dissolved in a solvent to form this fine-pattern forming agent.

The structure of the photo active polymer to be used in this example is expressed by the following formula:

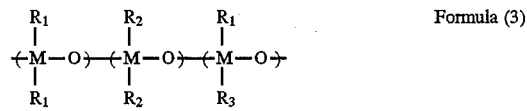

Formula (3)

$R_1$: $-CH_3$, $-C_2H_5$ $R_2$: $-CH=CH_2$ $R_3$: 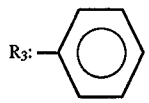

M: Pb, Zr, Ti, La, Ba, Bi, Si, Li and Nb where $R_1$ represents an alkyl group such as $-CH_3$ or $-C_2H_5$, $R_2$ represents an unsaturated functional group such as $-CH=CH_2$, $R_3$ represents an aryl group such as benzene, toluene, and M represents a metal-atom selected from the group consisting of at least Pb, Zr, Ti, La and Ba.

The photo active polymer contains metal-atoms selected from the group consisting of at least zirconium, lead, titan and lanthane, which are ferroelectric materials such as of PZR or PLZT. In this example, after the organic function groups have been removed, only the components for forming a ferroelectric film such as PZT will be left on the substrate. To oxidize and remove the organic components in molecules of the photo active polymer, the photo active polymer is treated at high temperature. With continued treatment at high temperature after the organic components are removed with only the ferroelectric components remaining, it will undergo crystallization to produce a perovskite structure which has a domain voluntarily polarized in a predetermined direction and is composed of fine crystal particles.

The photo active polymer is a polyalkoxide having the above-described metal-atoms as pivot atoms with which the organic functional groups are bonded, there being contained in the organic functional groups unsaturated bonds. The polymer and an aromatic bis-azide compound as expressed by the following formula (8) are mixed in a suitable solvent to form a fine-pattern forming agent of this example.

Figure 5:
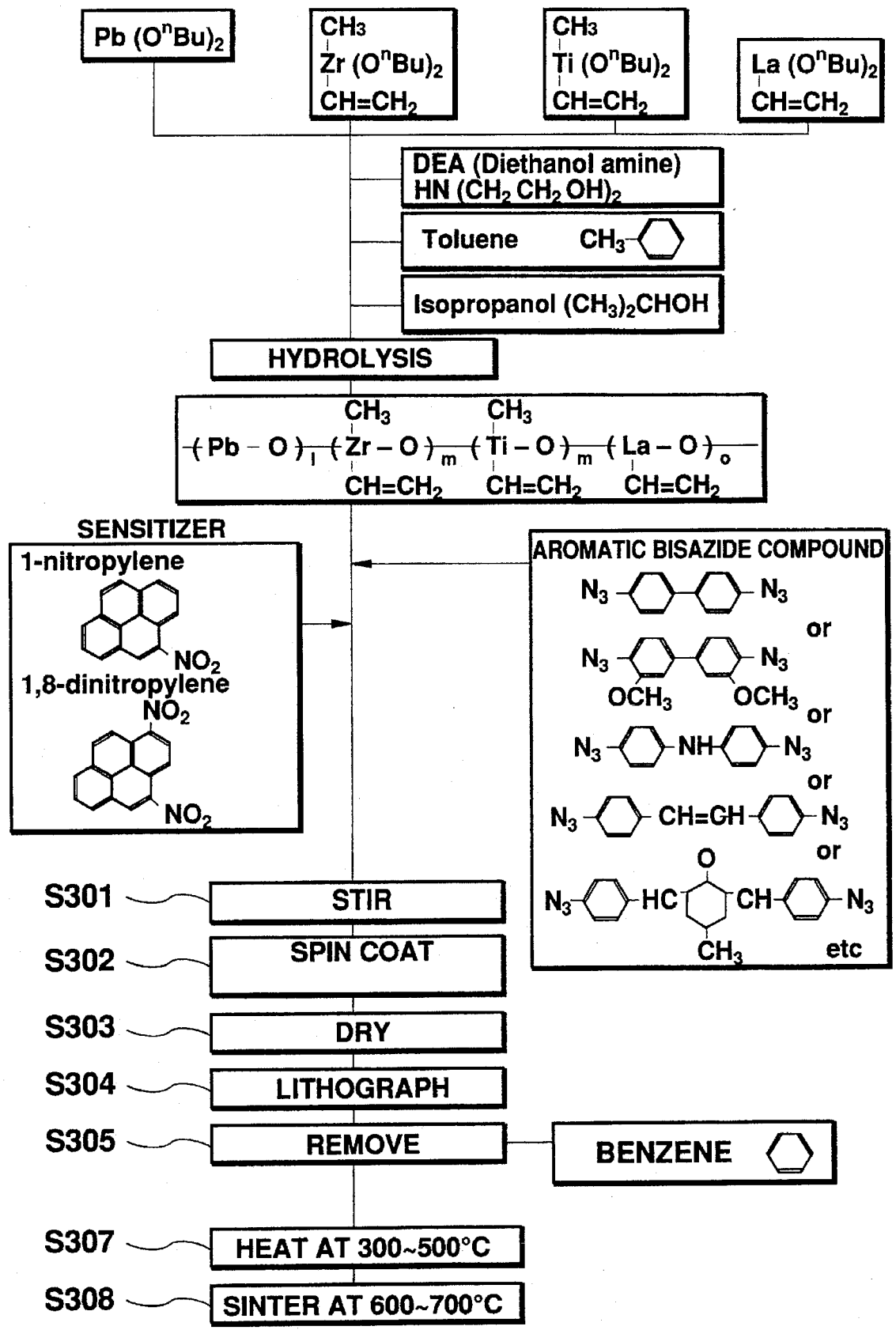
FIG. 5 is a flow diagram showing a succession of processing steps when producing a third pattern forming agent.

FIG. 5 shows the manner in which the third fine-pattern forming agent of this example, and also the manner in which a fine pattern of ferroelectric film is formed using the third fine-pattern forming agent.

Metal-butoxide having unsaturated bonds in molecules is mixed with the photo active polymer, and diethanol amine as a polymerization retardant is added to the resulting mixture. Further, toluene and isopropanol are added to this mixture to obtain a solution containing the metal butoxide. When water is added to this solution, hydrolysis will take place to produce normal butanol and metal hydroxides, whereupon metal hydroxides soon cause a polymerization reaction with one another to produce the photo active polymer.

Since the reaction is retarded by diethanol amine previously added to the reaction mixture, it is possible to adjust the molecular length of the base polymer and the molecular length of the photo active polymer; that is, it is possible to adjust the viscosity of the fine-pattern forming agent containing these polymers. If its viscosity is too high, such an agent is not suitable for the fine-pattern forming method of this invention. This is true partly because such a highly viscous agent is not suitable for being coated onto the substrate at a constant temperature and also because it is not suitable for being removed from the areas other than a predetermined pattern.

When an aromatic bisazide compound as expressed by the following formula (8) is added to the resulting solution having a predetermined viscosity, a fine-pattern forming agent of this example is formed. Further, a sensitizer (such as 1-nitropylene or 1,8-dinitropylene) as shown in FIG. 5 is added.

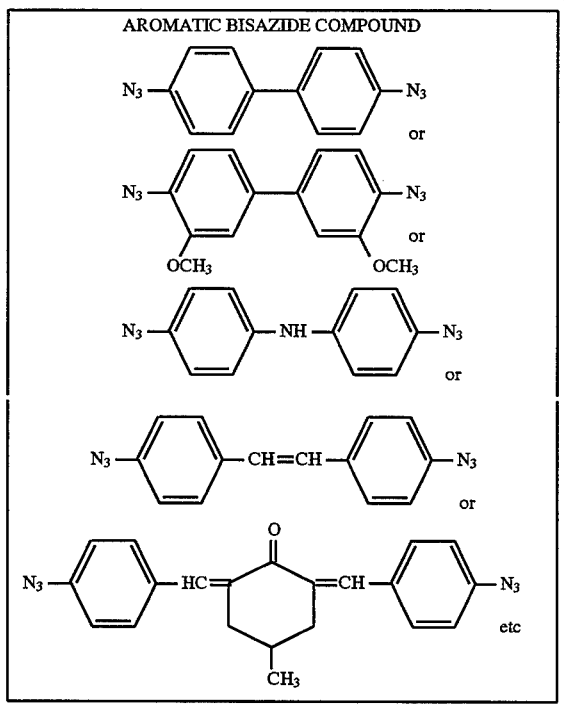

Formula (8)

PHOTO ACTIVE COMPOUND

The resulting mixture is stirred so as to have a uniform structure, whereupon in the coating step S201 it is coated uniformly over the substrate. In this example, spin coating is used to achieve uniform coating. After being dried for a while, the coated substrate is exposed at selected areas to ultraviolet rays, X-rays or corpuscular beams (hereinafter also called "electromagnetic waves").

Figure 6:
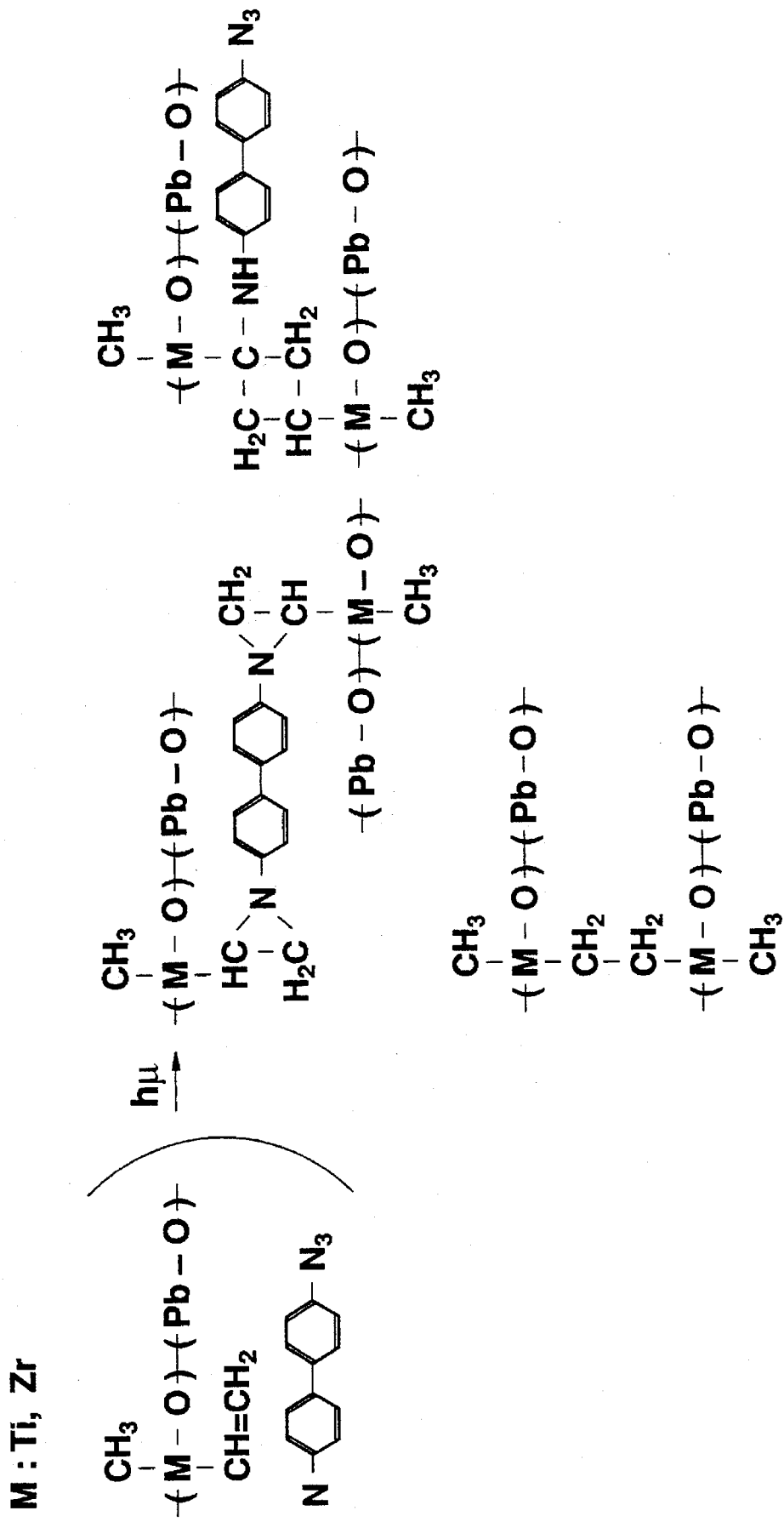
FIG. 6 shows the reaction mechanism in which crosslinks of the third pattern forming agent are formed.

When electromagnetic waves are radiated to this mixture, a crosslinking reaction will take place as shown in FIG. 6. Specifically, when the aromatic bis-azide compound is exposed to electromagnetic waves, nitrogen gas will become free and, at the same time, monovalent excited nitrogen will be produced in the molecule. The monovalent nitrogen then attacks the unsaturated bonds in the polyalkoxide molecule to cleave them for addition. Since the bis-azide compound has two azide groups, the addition reaction will take place at opposite ends of the molecule. So when a plurality of the photo active polymers are respectively attacked, crosslinks will be formed between these molecules. Since the crosslinked portion becomes a high polymer larger than that of the crosslink-free portion, only the crosslinked portion will be increased in visicosity and hence lower in fluidity so that such portions will become insoluble in virtually any organic solvent. Therefore, using a conventional organic solvent, it is possible to remove only the portions free from the crosslinking reaction, with the crosslinked portions remaining on the substrate.

In the lithographing step S304, light radiation takes place along a predetermined pattern. The crosslinking reaction occurs along this pattern so that only the exposed portions will become cured so as to be insoluble in virtually any solvent. In the removing step S305, using benzene as a solvent, the fine-pattern forming agent at the unexposed areas is removed and, at the same time, only the exposed portions remain on the substrate. In the removing step S305, the exposed portions can be removed with adjustable ease by adjusting the quantity of diethanol amine previously added to the reaction mixture as a polymerization retardant.

Subsequently, in the heating step S307, the fine-pattern forming agent is dried at 300° to 500° C. and, in the fireing step S308, it undergoes thermal treatment. During the fireing step S308, when the fine-pattern forming agent is heated at 600° to 700° C., the organic functional groups will be oxidized so as to be removed from the crosslinked high polymer compound, and at the same time, the residual metal-alkoxide portions are crystallized to have a perovskite structure.

In this example, light radiation is given to the fine-pattern forming agent along a predetermined pattern, whereupon the agent at the predetermined pattern is removed based on the viscosity difference between the exposed areas and the unexposed areas. Thus it is possible to form a fine pattern of ferroelectromagnetic film on the substrate without using any resist.

As described above, the fine-pattern forming agent of this example can be produced without using any resist, minimizing possible damage during dry etching and simplifying the process.

What is claimed is:

1. A method for forming a fine pattern of ferroelectric film, comprising the steps of:
   (a) coating onto a substrate a pattern forming agent for forming the fine pattern of ferroelectric film, said pattern forming agent being a solution containing a polyalkoxide having ferroelectric components in the backbone structure of the polyalkoxide, and functional groups attached to the backbone structure of the polyalkoxide to be activated when exposed to electromagnetic waves or corpuscular beams;
   (b) drawing a circuit pattern on the substrate by radiating electromagnetic waves or corpuscular beams along the circuit pattern;
   (c) developing the circuit pattern on the substrate by soaking the radiated substrate in an organic solvent having an aromatic group; and
   (d) firing the developed circuit pattern.

2. A method for forming a fine pattern of ferroelectric film, comprising the steps of:
   (a) coating onto a substrate a pattern forming agent for forming the fine pattern of ferroelectric film, said pattern forming agent being a solution containing a polyalkoxide having ferroelectric components in the backbone structure of the polyalkoxide, and functional groups attached to the backbone structure of the polyalkoxide to be activated when exposed to electromagnetic waves or corpuscular beams, said polyalkoxide being a metal-alkoxide polymer with unsaturated bonds;
   (b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

3. A method for forming a fine pattern of ferroelectric film, comprising the steps of:

(a) coating onto a substrate a pattern forming agent for forming the fine pattern of ferroelectric film, said pattern forming agent being a solution containing a polyalkoxide having ferroelectric components in the backbone structure of the polyalkoxide, and functional groups attached to the backbone structure of the polyalkoxide to be activated when exposed to electromagnetic waves or corpuscular beams, said polyalkoxide being a metal-alkoxide polymer having the following formula:

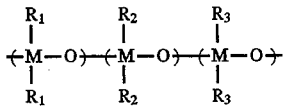

where $R_1$ represents an alkyl group, $R_2$ represents an unsaturated functional group, $R_3$ represents an aryl group and M represents a metal-atom selected from the group consisting of Pb, Zr, Ti, La, Ba, Bi, Si, Li and Nb;

(b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

4. A method for forming a fine pattern of ferroelectric film, comprising the steps of:

(a) coating onto a substrate a pattern forming agent for forming the fine pattern of ferroelectric film, said pattern forming agent being a solution containing a polyalkoxide having ferroelectric components in the backbone structure of the polyalkoxide, and functional groups attached to the backbone structure of the polyalkoxide to be activated when exposed to electromagnetic waves or corpuscular beams, said polyalkoxide being a metal-alkoxide polymer having the following formula:

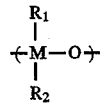

where M represents a metal-atom which is a ferroelectric compound, $R_1$ represents an alkyl group, and $R_2$ represents an alkyl group containing heteroatoms;

(b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

5. A method for forming a fine pattern of ferroelectric film, comprising the steps of:

(a) coating onto a substrate a pattern forming agent for forming the fine pattern of ferroelectric film, said pattern forming agent being a solution containing a polyalkoxide having ferroelectric components in the backbone structure of the polyalkoxide, and functional groups attached to the backbone structure of the polyalkoxide to be activated when exposed to electromagnetic waves or corpuscular beams, said polyalkoxide being a metal-alkoxide polymer having the following formula:

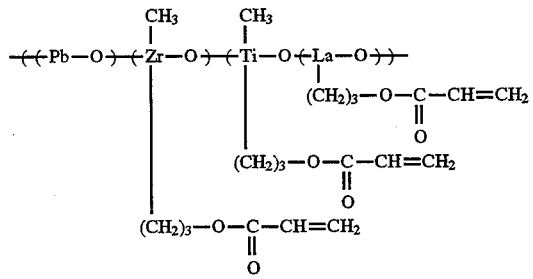

(b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

6. A method for forming a fine pattern of ferroelectric film, comprising the steps of:

(a) coating onto a substrate a pattern forming agent for forming the fine pattern of ferroelectric film, said pattern forming agent being a solution containing i) a polyalkoxide having ferroelectric components in the backbone structure of the polyalkoxide, and functional groups attached to the backbone structure of the polyalkoxide to be activated when exposed to electromagnetic waves or corpuscular beams, and ii) a photo active compound to be activated, when exposed to electromagnetic waves or corpuscular beams, so as to form crosslinks in said polyalkoxide;

(b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

7. A method for forming a fine pattern of ferroelectric film, comprising the steps of:

(a) coating onto a substrate a pattern forming agent for forming the fine pattern of ferroelectric film, said pattern forming agent being a solution containing i) a polyalkoxide having ferroelectric components in the backbone structure of the polyalkoxide, and functional groups attached to the backbone structure of the polyalkoxide to be activated when exposed to electromagnetic waves or corpuscular beams, and ii) a photo active compound to be activated, when exposed to electromagnetic waves or corpuscular beams, so as to form crosslinks in said polyalkoxide, said polyalkoxide being a metal-alkoxide polymer with unsaturated bonds, said photo active compound being an aromatic bisazide compound;

(b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

8. A method for forming a fine pattern of ferroelectric film, comprising the steps of:

(a) coating onto a substrate a pattern forming agent for forming the fine pattern of ferroelectric film, said pattern forming agent being a solution containing i) a polyalkoxide having ferroelectric components in the backbone structure of the polyalkoxide, and functional groups attached to the backbone structure of the polyalkoxide to be activated when exposed to electromagnetic waves or corpuscular beams, and ii) a photo active compound to be activated, when exposed to electromagnetic waves or corpuscular beams, so as to form crosslinks in said polyalkoxide, said polyalkoxide being a metal-alkoxide polymer with unsaturated bonds, said metal-alkoxide polymer being expressed by the following formula:

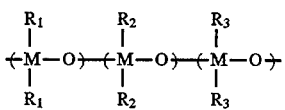

wherein $R_1$ is an alkyl group, $R_2$ is an unsaturated functional group, $R_3$ is an aryl group, M is a metal-atom which is a material ferroelectric compound, and said photo active compound being an aromatic bisazide compound expressed by the following formula:

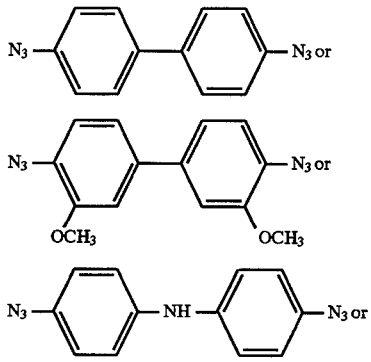

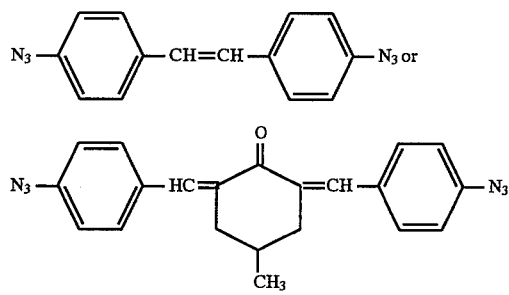

(b) drawing a circuit pattern on the substrate by radiating electromagnetic waves or corpuscular beams along the circuit pattern;

(c) developing the circuit pattern on the substrate by soaking the radiated substrate in an organic solvent having an aromatic group; and (d) firing the developed circuit pattern.

9. A method according to claim 7, wherein said solvent used in said developing step is benzene.

10. A method according to claim 8, wherein said solvent used in said developing step is benzene.

11. A method for forming a fine pattern of ferroelectric film according to claim 3, wherein said metal-atom of said pattern forming agent which is a material ferroelectric compound is selected from the group consisting of Pb, Zr, Ti, La and Ba.

12. A method for forming a fine pattern of ferroelectric film according to claim 4, wherein said metal-atom of said pattern forming agent which is a material ferroelectric compound is selected from the group consisting of Pb, Zr, Ti, La, Ba, Bi, Si, Li and Nb.

13. A method for forming a fine pattern of ferroelectric film according to claim 8, wherein said metal-atom of said pattern forming agent which is a material ferroelectric compound is selected from the group consisting of Pb, Zr, Ti, La, Ba, Bi, Si, Li and Nb.

14. A method according to claim 3, wherein said organic solvent used in said developing step (c) is benzene.

15. A method according to claim 4, wherein said organic solvent used in said developing step (c) is benzene.

16. A method according to claim 3, wherein said organic solvent used in said developing step (c) is toluene.

17. A method according to claim 4, wherein said organic solvent used in said developing step (c) is toluene.

* * * * *